United States Patent [19]
Haulin

[11] Patent Number: 5,140,594
[45] Date of Patent: Aug. 18, 1992

[54] METHOD AND DEVICE FOR AVOIDING LATENT ERRORS IN A LOGIC NETWORK FOR MAJORITY SELECTION OF BINARY SIGNALS

[75] Inventor: Tord L. Haulin, Uppsala, Sweden

[73] Assignee: Telefonaktiebolaget L M Ericsson, Stockholm, Sweden

[21] Appl. No.: 510,831

[22] Filed: Apr. 18, 1990

[30] Foreign Application Priority Data

May 12, 1989 [SE] Sweden ................... 8901723

[51] Int. Cl.$^5$ .................................. G06F 11/18
[52] U.S. Cl. ............................. 371/36; 371/8.1; 307/464; 307/441
[58] Field of Search ............ 371/36, 8.1; 307/441, 307/442, 445, 464, 470, 239, 257

[56] References Cited

U.S. PATENT DOCUMENTS

| | | | |
|---|---|---|---|
| 4,355,683 | 10/1982 | Griffiths | 165/60 |
| 4,468,574 | 8/1984 | Engeler et al. | 307/451 |
| 4,555,721 | 11/1985 | Bansal et al. | 357/42 |
| 4,583,224 | 4/1986 | Ishii et al. | 371/36 |
| 4,617,475 | 10/1986 | Reinschmidt | 371/36 X |

FOREIGN PATENT DOCUMENTS 2093614 9/1982 United Kingdom.

Primary Examiner—Jerry Smith
Assistant Examiner—Allen M. Lo
Attorney, Agent, or Firm—Burns, Doane, Swecker & Mathis

[57] ABSTRACT

A method for avoiding latent errors in a logic network for majority selection of binary signals in a triplicated system. Errors which result from errors or faults in one of two or more parallel-connected transistors of one or more separate logic devices included in the logic network are avoided by repeatedly switching each of the separate logic devices in a manner such that transistors which were parallel-connected become series-connected, and vice versa. As a result, these devices will perform alternately logic operations which are the dual correspondence of one another, e.g. NAND- and NOR-operations with the aid of the same transistors (61-66) in both instances. Thus, in practice, majority selection will be performed alternately with two mutually different logic networks, which are the dual correspondence of each other.

8 Claims, 3 Drawing Sheets

METHOD AND DEVICE FOR AVOIDING LATENT ERRORS IN A LOGIC NETWORK FOR MAJORITY SELECTION OF BINARY SIGNALS

TECHNICAL FIELD

The invention relates to a method and device for avoiding latent errors in a logic network for majority selection of binary signals in a tripled system, in which the logic network includes a plurality of separate logic devices for carrying-out logic operations, for instance NAND- and/or NOR-operations, and in which each of the separate logic devices includes parallel-connected semi-conductor components, each of which receives a respective logic input signal, and also series-connected semi-conductor components, each of which receives a respective logic input signal.

BACKGROUND ART

Triplicated digital systems are sometimes used in, for instance, telecommunication systems for safety reasons. In this respect, there are used three parallel branches in which identical operations are carried out. Downstream of given function blocks incorporated in said branches, a majority selection is made between mutually corresponding output signals from the three function blocks. Consequently, the malfunction of one of said three function blocks will have no significance. The system is thus tolerant to single errors and to multiple errors which do not overlap one another in time and space.

In order for a faulty or erroneous system function to be discovered, it is necessary to use the function concerned. System functions which remain unused over long periods of time can be encumbered with one or several latent errors which are not discovered and reported. Majority selection functions are additionally prone to this drawback, since this function is not tested until an error has occurred. In normal cases, i.e. when the function blocks are error-free, the output signals from the function blocks which correspond to one another in the three branches are equal. Consequently, latent errors may be present in the devices which carry out majority selection, these errors remaining undiscovered for as long as the function blocks are error-free and produce mutually identical output signals.

The devices which carry out majority selection comprise, for instance, logic networks composed of separate logic devices, e.g. NAND and/or NOR-gates, which contain, inter alia, two or more parallel-connected and series-connected transistors. A fault in such a transistor will normally remain undiscovered until a particular type of error occurs in a separate function block, which may not occur for a very long time, wherewith overlapping errors resulting in system malfunction may occur.

DISCLOSURE OF THE INVENTION

The problem of latent errors due to errors or faults in one of two or more series-connected or parallel-connected transistors in the separate logic devices of the logic networks for majority selection is avoided by repetitive switching in each of said logic devices. Switching is effected such that transistors which were parallel-connected become series-connected, and vice versa. Consequently, the logic devices will alternately carry-out logic operations which have respective dual correspondence, e.g. NAND- and NOR-operations, with the aid of the same transistors in both cases. In this way, a switch is made between two logic networks which are the dual correspondence of one another, and in practice the majority selection will be effected alternately with two mutually different logic networks. Because transistors which were connected in parallel become connected in series, and vice versa, an interruption or a short circuit in one of the transistors or its control line will be discovered when the transistor is connected in series instead of in parallel, or vice versa.

The invention is characterized by the features set forth in the following claims.

BRIEF DESCRIPTION OF DRAWINGS

The invention will now be described in more detail with reference to the accompanying drawings, in which.

BEST MODES OF CARRYING OUT THE INVENTION

Figure 1:
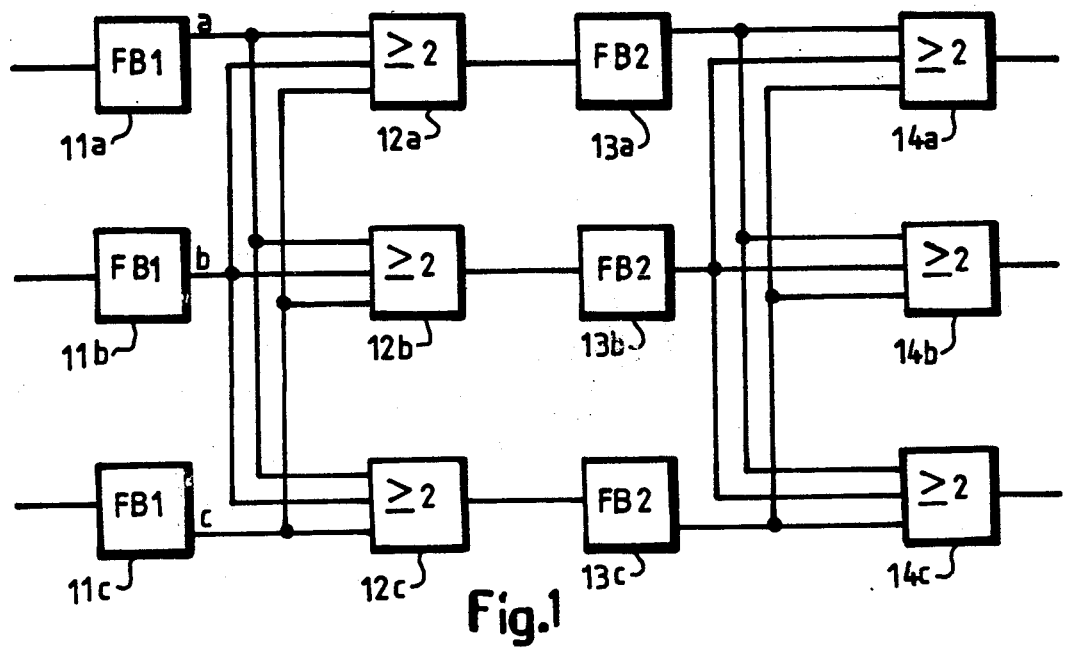
FIG. 1 illustrates part of a triplicated system.

FIG. 1 illustrates a part of a triplicated system. The reference signs $11a-11c$ identify three mutually identical function blocks, each located in a respective branch of three mutually identical branches. Each function block may, for instance, consist of a circuit board having a plurality of components, although, as will be understood, the block may consist of units which are larger or smaller than a circuit board. In normal circumstances, each of the blocks $11a-11c$ will receive mutually similar input signals and produce mutually similar output signals, a-c. Each of the output signals a-c is applied to a respective one of three devices $12a-12c$ for majority selection. Each of these devices produces an output signal equal to the value occurring on the majority, i.e. at least two, of the outputs from the blocks $11a-11c$. Consequently, the output signals from the majority selection devices $12a-12c$ will be mutually similar, even if one of the blocks $11a-11c$ is faulty. The output signals from the majority selection devices $12a-12c$ is applied to a respective one of three new function blocks $13a-13c$, the output signals of which are, in turn, applied to three new majority selection devices $14a-14c$. It will be understood that the number of function blocks between two majority selection devices can vary.

It should be mentioned that a report to the effect that an error has occurred in one of the function blocks can be readily reported automatically, by comparing each of the output signals from the three function blocks of mutual correspondence with the output signal from the device which has carried out the majority selection between the signals. This comparison can be effected, for instance, with the aid of EXOR-gates. The error, however, may have occurred in the majority selection device concerned.

Figure 2:
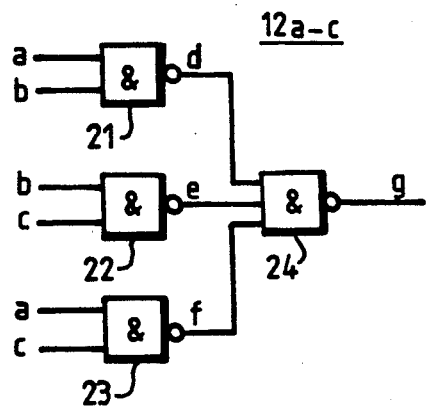
FIGS. 2 and illustrate two different exemplifying embodiments of a device for majority selection incorporated in the system shown in FIG. 1.

FIG. 2 illustrates a first example of realizing a majority selection device. This device consists of three NAND-gates 21-23, which obtain the signals a and b, b and c, and a and c respectively on the inputs thereof. Thus, with these references, the majority selection device corresponds to one of the devices 12a-12c in FIG. 1. The gates 21-23 produce output signals d-f, which are applied to a NAND-gate 24, which in turn produces an output signal g.

Figure 3:
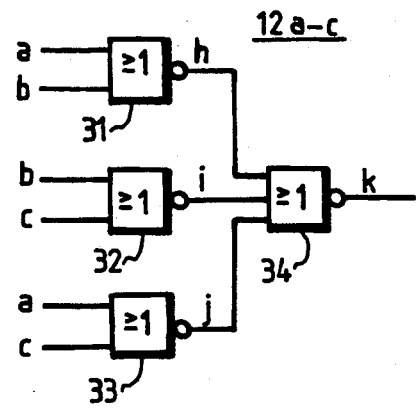

FIG. 3 illustrates another example of realizing a majority selection device. In this case, the NAND-gates in the device illustrated in FIG. 2 have been replaced with NOR-gates 31-34. The output signals produced by said gates are referenced h-k.

It can be mentioned that the logic networks shown in FIGS. 2 and 3 are the dual correspondence of one another.

It will be seen from the following truth table that both the output signals g and k coincide with the majority of the input signals a-c for different values thereof.

| a b c | d e f | g | h i j | k |
|-------|-------|---|-------|---|
| 000   | 111   | 0 | 111   | 0 |
| 001   | 111   | 0 | 100   | 0 |
| 010   | 111   | 0 | 001   | 0 |
| 011   | 101   | 1 | 000   | 1 |
| 100   | 111   | 0 | 010   | 0 |
| 101   | 110   | 1 | 000   | 1 |
| 110   | 011   | 1 | 000   | 1 |
| 111   | 000   | 1 | 000   | 1 |

Figure 4:
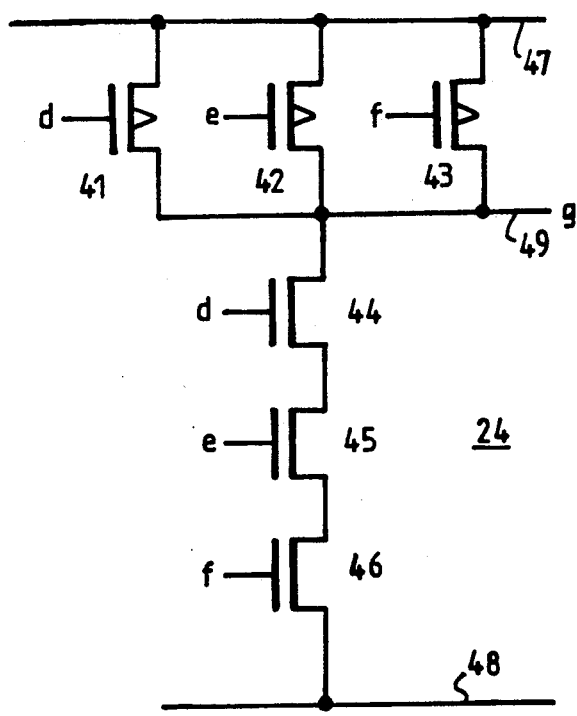
FIG. 4 illustrates an example of realizing a NAND-gate included in the device illustrated in FIG. 2.

FIG. 4 illustrates an exemplifying embodiment of a NAND-gate. This gate corresponds to the gate 24 in FIG. 2 and thus has three inputs which receive the signals d-f. The gate includes three parallel-connected P-type CMOS-transistors 41-43 and three series-connected N-type CMOS-transistors 44-46. A high and low supply-voltage is applied to conductors 47 and 48 respectively. The gate output consists of a conductor. Each of the P-transistors 41-43 conducts for low control-voltage, i.e. for a zero, whereas each of the N-transistors 44-46 conduct for high control-voltage, i.e. for a one. Consequently, the output signal will be low, i.e. zero, only when all input signals d-f are high, i.e. ones. In other cases, the output signal will be high, i.e. a one. This is in agreement with a logic NAND-condition.

Each of the gates 21-23, which have only two inputs, can also be realized as the gate shown in FIG. 4, although with the modification that two inputs are connected together.

As before mentioned, the latent error can be present in a majority selection device of said kind, due to the fact that one or two of the parallel-connected transistors are faulty and that the fault has not been discovered. Provided that the input signals are the same, a permanent break-down in one or two of the parallel-connected transistors will go undiscovered. An error or fault which occurs as a permanent short-circuit in one of the series-connected transistors will also go undiscovered. The input signals to a majority selection device will be mutually the same when the three mutually corresponding function blocks connected to the input side of the majority selection device are error free and when the nearest preceding majority selection device is also error free.

Figure 5:
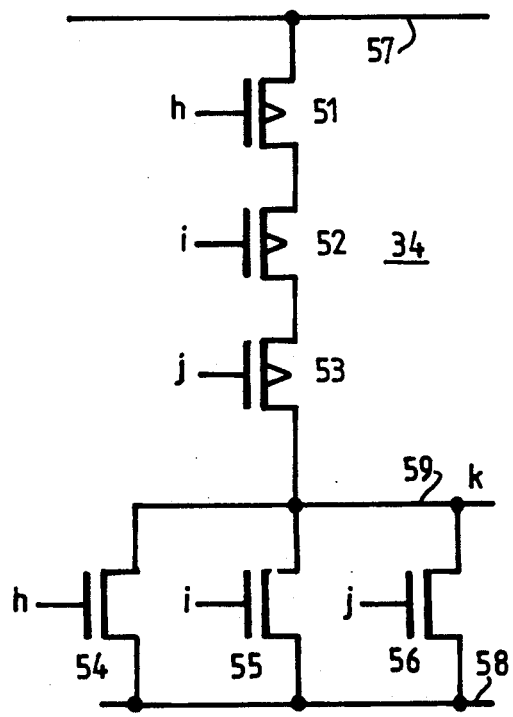
FIG. 5 illustrates an example of realizing a NOR-gate included in the device illustrated in FIG. 2.

As will be understood from the aforegoing, the majority selection can also be effected with a NOR-gate network according to FIG. 3. FIG. 5 illustrates an embodiment of a NOR-gate. This gate corresponds to the gate 34 of the FIG. 3 embodiment and has three inputs. The gate is constructed of transistors similar to those of the NAND-gate 24 according to FIG. 4. The transistors connected in parallel in the FIG. 4 embodiment are, however, connected in series in the FIG. 5 embodiment and are referenced 51-53, whereas the transistors connected in series in FIG. 4 are connected in parallel in FIG. 5 and are referenced 54-56. High and low supply-voltage and the output of the gate are connected to conductors 57-59. When all input signals h-j have the value zero, each of the series-connected P-transistors 51-53 become conductive and none of the parallel-connected N-transistors 54-56. The gate output-signal will then be a one. In other cases, the output signal is a zero, which agrees with a logic NOR-condition.

This gate may also have a latent fault, due to the fact that one or two of the parallel-connected or series-connected transistors is faulty, without this fault being detected while the input signals are mutually the same.

It can be mentioned that NAND- and NOR-functions are the dual correspondence of one another.

Figure 6:
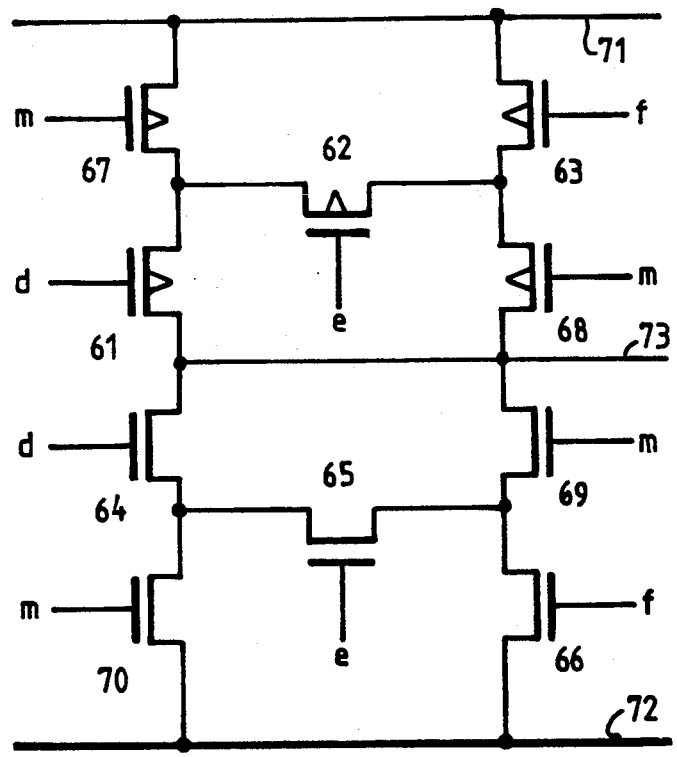
FIG. 6 illustrates an example of a controllable logic device which can be included in a device for majority selection.

FIG. 6 illustrates an example of a controllable logic device which can be included in a majority selection device. The logic device includes ten CMOS transistors, of which five, 61-63 and 67-68, are P-type transistors, and five, 64-66 and 69-70, are N-type transistors. The transistors 61-63 and 64-66 receive input signals d-f which correspond to the same signals in the NAND-gate 24 according to FIGS. 2 and 4. The transistors 67-70 receive a control signal m, which alternates between a zero and a one. High supply-voltage, low-supply voltage and the output of the logic device are applied to conductors 71, 72 and 73 respectively.

The transistors 67-68 are conductive when the control signal m is a zero, under which condition the transistors 69-70 will be nonconductive. Consequently, in practice, the transistors 61-63 will be connected in parallel between the high supply-voltage and the output 73. The lower half of the Figure is, in practice, reduced at the same time to a series-connection of the transistor 64-66 between the output and the low supply-voltage. The logic device thus corresponds in this case to the NAND-gate illustrated in FIG. 4.

When the control signal m is a one, the transistors 67-68 will, instead, be non-conducting, whereas the transistors 69-70 are conducting. In this way, the upper half of the Figure is reduced to a series-connection of the transistors 61-63, whereas the transistors 64-66 are connected in parallel. Thus, the logic device will in this case correspond to the NOR-gate shown in FIG. 5.

By permitting the control signal m to assume the values zero and one alternately, the controllable logic device according to FIG. 6 will function alternately as a NAND-gate and as a NOR-gate. Four controllable logic devices of this kind can be used as separate NAND-gates in a majority selection device according to FIGS. 2 or 3. The gates which have only two inputs are therewith realized advantageously as a three-input gate, although with two inputs connected together. By using four controllable logic devices of the kind illustrated as a majority selection device according to FIGS. 2 or 3, majority selection will at times be carried out with four NAND-gates and at times with four NOR-gates. Thus, in practice, majority selection is effected alternately with two mutually different logic networks, each of which is the dual correspondence of the other. Since the same transistors are used in both instances and since the transistors which were parallel-connected in the one instance are series-connected in the other instance, and vice versa, a fault in one of the transistors or the connections thereto will no longer be latent. This is explained by the fact that any interruption in one of the transistors will be discovered when it is switched to a series-connection, while any short circuit will be discovered when it is switched to a parallel-connection. Naturally, some form of arrangement is required for reporting the fault or error automatically, for example an arrangement which includes EXOR-gates in accordance with the aforegoing.

When the controllable logic device according to FIG. 6 functions as a NAND-gate, current will pass through respective transistors 62 and 65 in a first direction, whereas when the logic device functions as a NOR-gate, the currents will, instead, pass in the opposite direction. This makes CMOS-transistors suitable for inclusion in a device of this kind. Such transistors namely have good current conductivity in both directions.

The majority selection devices need not necessarily be comprised of solely NAND-gates or solely NOR-gates. A study of the majority selection device illustrated in FIG. 2 will show that the output signal g with logic algebra can be designated $g=((a \times b)' \times (b \times c)' \times (a \times c)')'$, where the primes signify inversion. The expression can be converted, with the aid of de Morgan's theorems, to $g = a \times b + b \times c + a \times c$, which corresponds to a logic network of the kind illustrated in FIG. 7. This network comprises three AND-gates 71–73 and one OR-gate 74.

Figure 7:
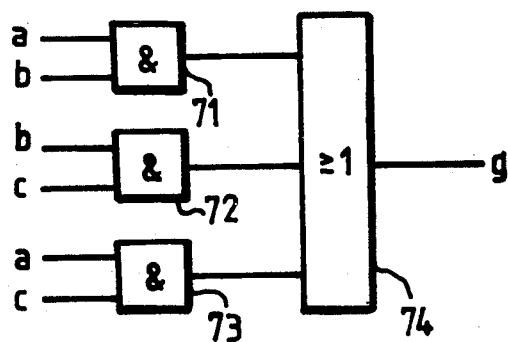
FIGS. 7-10 illustrates four further examples of a device for majority selection.

In practice, NAND and NOR-gates are preferred to AND- OR-gates respectively. Consequently, a network according to FIG. 7 is often realized in practice instead of a network according to FIG. 8. In this network, the AND-gates 71–73 of the FIG. 7 embodiment have been replaced with NAND-gates 81–83, each having a respective inverter 85–87, and the OR-gate 74 has been replaced with a NOR-gate 84, having an inverter 88. Each of the gates 81–84 can consist of a controllable logic device according to FIG. 6. In this case, the control signal m applied to the logic devices which are intended to function as NAND-gates shall be a zero, whereas the control signal applied to the logic device intended to function as a NOR-gate shall be a one.

Figure 8:
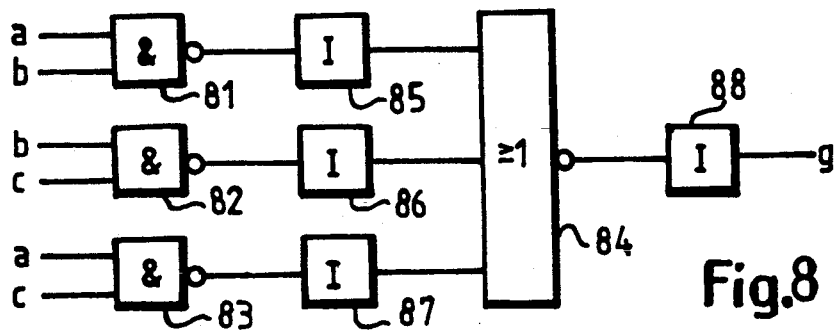
Figure 9:
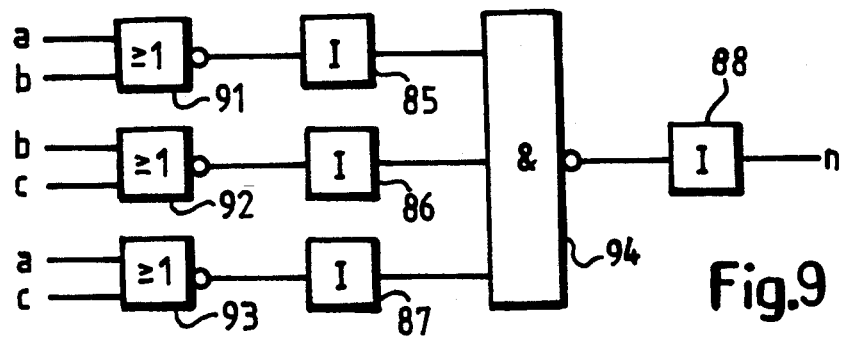

By simultaneously switching the control signals from zero to one, and vice versa, there is obtained a logic network which is the dual correspondence of the network illustrated in FIG. 8. One such dual network is illustrated in FIG. 9. Compared with the FIG. 8 embodiment, the NAND-gates 81–83 have thus been replaced with NOR-gates 91–93 and the NOR-gate 84 has been replaced with a NAND-gate 94. The output signal of the network is referenced n. It will be seen that each NOR-gate, e.g. 91, with its inverter, e.g. 85, can be replaced by an OR-gate, and that the NAND-gate 94, with its inverter 88, can be replaced with an AND-gate. This corresponds to a logic network illustrated in FIG. 10, where the gates are referenced 101–104. The output signal can be designated: $n=(a+b) \times (b+c) \times (a+c)$, which with the aid of de Morgan's theorems can be converted to $n=((a+b)'+(b+c)'+(a+c)')'$. This expression coincides with the expression obtained with a logic network having four NOR-gates in accordance with FIG. 3, which has the same function as the logic network according to FIG. 2. Thus, the majority selection function can also be carried out with logic networks according to FIGS. 8 and 9, for instance, each of these logic networks consisting of both NAND and NOR gates.

Figure 10:
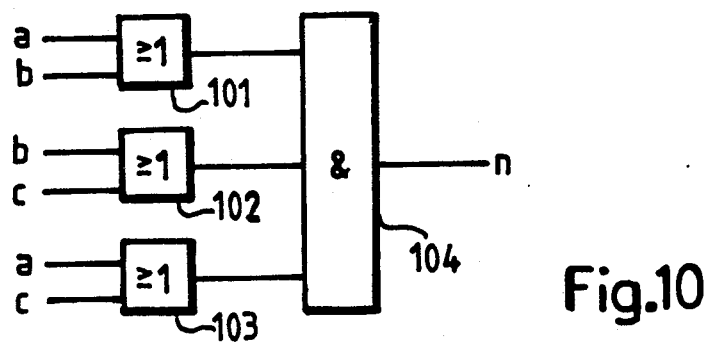

The logic networks illustrated in FIGS. 7 and 10 are also the dual correspondence of one another.

When the transistors 61–63 of the logic device according to FIG. 6 are N-type transistors instead of P-type transistors, and when the transistors 64–66 are P-type transistors instead of N-type transistors, said device will effect logic AND- or OR-operations instead of NAND- or NOR-operations. More specifically, the logic device will function as an OR-gate when the transistors 61–63 are connected in parallel and the transistors 64–66 are connected in series and as an AND-gate in the converse case. This enables the logic device to be used to switch between the AND-OR-networks according to FIGS. 7 and 10. These types of network, however, must be provided with amplifiers in order to be used in practice.

As will be understood, the logic device illustrated in FIG. 6 can be modified to include two plus two transistors having control electrodes connected to the inputs of the logic device. In this way, there is obtained logic gates having two inputs instead of three. As will be understood from the aforegoing, however, this is not necessary, since two of the three inputs can, instead, be mutually connected with the intention of obtaining a gate having two inputs.

The gates and the logic device according to FIGS. 4–6 are made up of CMOS-transistors. However, other semiconductor components may be used instead of CMOS-transistors.

I claim:

1. A majority selector circuit having semiconductor components, said selector comprising:
    at least first, second and third signal inputs to receive mutually similar input signals;
    a switching input to receive a switching signal and allow switching said components between a first circuit configuration and a second circuit configuration in response to said switching signal
       said first circuit configuration interconnecting a first set of the components in a substantially parallel arrangement and a second set of the components in a substantially series arrangement;
    said second circuit configuration interconnecting said first set of the components in a substantially series arrangement and the second set of said components in a substantially parallel arrangement; and
    a signal output to transmit an outer signal equal to a majority of said input signals, said output signal being independent of said switching signal.

2. The majority selector of claim 1 wherein said first circuit configuration interconnects said components to form
    at least three initial NAND devices each having at least two inputs and one output, and one final NAND device having at least three inputs and one output;
    each initial NAND device output being connected to an input of the final NAND device;
    said initial NAND inputs being configured as said signal inputs;
    said final NAND device output being said signal output; and
    said second circuit configuration interconnects said components to form at least three initial NOR devices each having at least two inputs and one output, and one final NOR device having at least three inputs and one output;

each initial NOR device output being connected to an input of the final NOR device;

said initial NOR inputs being configured as said signal inputs; and said final NOR device output being said signal output.

3. The majority selector of claim 1 wherein said first circuit configuration interconnects said components to form at least three NAND devices each having at least two inputs and one output, said NAND devices' inputs being configured as said signal inputs;

at least three initial inverters each having an input and an output and each initial inverter input being connected to one corresponding NAND device output;

a NOR device having at least three inputs and an output, each initial inverter output being connected to one corresponding NOR device input;

one final inverter having an input and an output, said NOR device output being connected to said final inverter input and said final inverter output being said signal output; and said second circuit configuration interconnects said components to form at least three NOR devices each having at least two inputs and one output, said NOR devices' inputs being configured as said signal inputs;

at least three initial inverters, each having an input and an output and each initial inverter input being connected to one corresponding NOR device output;

a NAND device having at least three inputs and an output, each initial inverter output being connected to one corresponding NAND device input;

one final inverter having an input and an output, said NAND device output being connected to said final inverter input and said final inverter output being said signal output.

4. The majority selector of claim 1 wherein said first circuit configuration interconnects said components to form at least three AND devices each having at least two inputs and one output, said AND devices' inputs being configured as said signal inputs;

an OR device having at least three inputs and an output, each AND device output being connected to one corresponding OR device input;

said OR device output being said signal output; and said second circuit configuration interconnects said components to form at least three OR devices each having at least two inputs and one output, said OR devices' inputs being configured as said signal inputs;

an AND device having at least three inputs and an output, each OR device output being connected to one corresponding AND device input; and said AND device output being said signal output.

5. A method for detecting latent errors in a majority selection circuit comprising the steps of:

connecting semiconductor components in a circuit having at least first, second, and third signal inputs, a switching input for receiving a switching signal and switching said components between a first circuit configuration and a second circuit configuration in response to said switching signal, and a signal output for transmitting an output signal equal to a majority of said input signals, said output signal being independent of said switching signal;

supplying a first switching signal to said switching input to configure said components in a first circuit configuration having a first set of the components in a substantially parallel arrangement and a second set of the components in a substantially series arrangement;

inputting at least one set of mutually similar first input signals to said signal inputs and generating a first output signal corresponding to each set of first input signals;

comparing the first output signal to the corresponding first input signals and reporting any difference;

supplying a second switching signal to said switching input to configure said components in a second circuit configuration having the first set of components in a substantially series arrangement and the second set of components in a substantially parallel arrangement;

inputting at least one set of mutually similar second input signals to said signal inputs and generating a second output signal corresponding to each set of second input signals;

comparing the second output signal to the corresponding second input signals and reporting any difference.

6. The method of claim 5 wherein said first circuit configuration interconnects said components to form at least there initial NAND devices each having at least two inputs and one output, and one final NAND device having at least three inputs and one output;

each initial NAND device output being connected to an input of the final NAND device;

said initial NAND inputs being configured as said signal inputs;

said final NAND device output being said signal output; and said second circuit configuration interconnects said components to form at least three initial NOR devices each having at least two inputs and one output, and one final NOR device having at least three inputs and one output;

each initial NOR device output being connected to an input of the final NOR device;

said initial NOR inputs being configured as said signal inputs; and said final NOR device output being said signal output.

7. The method of claim 5 wherein said first circuit configuration interconnects said components to form at least three NAND devices each having at least two inputs and one output, said NAND devices' inputs being configured as said signal inputs;

at least three initial inverters each having an input and an output and each initial inverter input being connected to one corresponding NAND device output;

a NOR device having at least three inputs and an output, each initial inverter output being connected to one corresponding NOR device input;

one final inverter having an input and an output, said NOR device output being connected to said final inverter input and said final inverter output being said signal output; and
said second circuit configuration interconnects said components to form
- at least three NOR devices each having at least two inputs and one output, said NOR devices' inputs being configured as said signal inputs;
- at least three initial inverters, each having an input and an output and each initial inverter input being connected to one corresponding NOR device output;
- a NAND device having at least three inputs and an output, each initial inverter output being connected to one corresponding NAND device input;
- one final inverter having an input and an output, said NAND device output being connected to said final inverter input and said final inverter output being said signal output.

8. The method of claim 5 wherein said first circuit configuration interconnects said components to form
- at least three AND devices each having at least two inputs and one output, said AND devices' inputs being configured as said signal inputs;
- an OR device having at least three inputs and an output, each AND device output being connected to one corresponding OR device input;
- said OR device output being said signal output; and
said second circuit configuration interconnects said components to form
- at least three OR devices each having at least two inputs and one output, said OR devices' inputs being configured as said signal inputs;
- an AND device having at least three inputs and an output, each OR device output being connected to one corresponding AND device input; and
- said AND device output being said signal output.

* * * * *